United States Patent [19]
Lal et al.

[11] Patent Number: 5,456,978
[45] Date of Patent: Oct. 10, 1995

[54] THIN-FILM RECORDING MEDIUM WITH THIN METAL SUBLAYER

[75] Inventors: Brij B. Lal, San Jose; Tadashi Shinohara, Fremont, both of Calif.

[73] Assignee: HMT Technology Corporation, Fremont, Calif.

[21] Appl. No.: 101,230

[22] Filed: Aug. 3, 1993

[51] Int. Cl.$^6$ .............................. B32B 5/16; G11B 5/66; B05D 5/12; C23C 14/00
[52] U.S. Cl. ..................... 428/332; 428/336; 428/408; 428/666; 428/667; 428/693; 428/698; 428/694 T; 428/694 TS; 428/694 TP; 428/694 TC; 428/701; 428/702; 428/65.5; 204/192.1; 204/192.2; 427/127; 427/128; 427/130; 427/131; 427/132
[58] Field of Search ............................ 428/900, 64, 65, 428/694 T, 694 TS, 694 TP, 611, 694 TC, 666, 667, 693, 698, 332, 336, 408, 701, 702; 204/192.1, 192.2; 427/127, 128, 130, 131, 132

[56] References Cited

U.S. PATENT DOCUMENTS

| | | | |
|---|---|---|---|
| 4,833,020 | 5/1989 | Shiroishi et al. | 428/336 |
| 5,082,747 | 1/1992 | Hedgcoth | 428/611 |
| 5,122,423 | 6/1992 | Hase et al. | 428/694 |
| 5,316,631 | 5/1994 | Ando | 204/192.2 |
| 5,316,844 | 5/1994 | Suzuki | 428/323 |
| 5,344,706 | 9/1994 | Lambeth | 428/336 |

FOREIGN PATENT DOCUMENTS

92102454  6/1990  Japan.

OTHER PUBLICATIONS

Fisher, R. D., et al., "Magnetic Properties and Longitudinal Recording Performance of Corrosion-Resistant Alloy Films," *IEEE Trans. Mag.* 22: 352–354 (1986).
Futamoto, M., et al., "Investigation of 2 Gb/in$^2$ Magnetic Recording at a Track Density of 17 kTPI," *IEEE Trans. Mag.* 27(6): 5280–5285 (1991).
Howard, J. K., "Thin films for magnetic recording technology: A review," *J. Vac. Sci. Technol. A* 4(1): 1–13 (1986).
Hughes, G. F., "Magnetization reversal in cobalt–phosphorus films," *J. Appl. Phys.* 54(9): 5306–5313 (1983).
Johnson, K. E., et al., "Dependence of Magnetic Media Noise on Ultra–Thin Cr Underlayer Thickness," *IEEE Trans. Mag.* 28(5): 3099–3101 (1992).
Johnson, K. E., et al., "The effect of Cr underlayer thickness on magnetic and structural properties of CoPtCr thin films," *J. Appl. Phys.* 67(9): 4686–4688 (1990).
Kitada, M., and N. Shimizu, "Magnetic properties of sputtered Co–Pt thin films," *J. Appl. Phys.* 54(12): 7089–7094 (1983).
Kogure, T., and S. Katayama, "High–coercivity magnetic hard disks using glass substrates," *J. Appl. Phys.* 67(9): 4701–4703 (1990).
Lal, B. B., et al., "A New Series of Quaternary Co–Alloys for High Density Rigid–disk Applications," *IEEE Trans. Mag.* 27(6): 4739–4741 (1991).
Miura, S., et al., "Noise and Bit Jitter Performance of CoNiPt Thin Film Longitudinal Recording Media and its Effect on Recording Performance," *IEEE Trans. Mag.* 24(6): 2718–2720 (1988).
Sanders, I. I., et al., "Magnetic and Recording Characteristics of Very Thin Metal–Film Media," *IEEE Trans. Mag.* 25(5): 3869–3871 (1989).
Shiroishi, Y., et al., "Read and Write Characteristics of Co–Alloy/Cr Thin Films for Longitudinal Recording," *IEEE Trans. Mag.* 24(6): 2730–2732 (1988).
Yogi, T., et al., "Dependence of Magnetics, Microstructures and Recording Properties on Underlayer Thickness in CoNiCr/Cr Media," *IEEE Trans. Mag.* 24(6): 2727–2729 (1988).

*Primary Examiner*—L. Kiliman
*Attorney, Agent, or Firm*—Peter J. Dehlinger; Judy M. Mohr

[57] ABSTRACT

A magnetic thin-film medium formed on a non-metallic substrate and having reduced noise characteristics, by virtue of a 5–50 Å, sputtered Cr-containing sublayer interposed between the substrate and a chromium underlayer. Also disclosed is a method of preparing the low-noise medium.

8 Claims, 5 Drawing Sheets

THIN-FILM RECORDING MEDIUM WITH THIN METAL SUBLAYER

FIELD OF THE INVENTION

The present invention relates to a thin-film magnetic recording medium and to a method of producing the same.

REFERENCES

Fisher, R. D., et al., IEEE Trans. on Magn., 22:352 (1986).
Howard, J. K., J Vac Sci Technol, A4(1):1 (1986).
Hughes, G. F., J Appl Phys, 54:5306 (1983).
Johnson, K. E., et al., J. Appl Phys, 67:4686 (1990).
Johnson, K. E., et al., IEEE Trans. on Magn, 28(5):3100 (1992).
Kitaka, M., et al., J Appl Phys, 54(12):7089 (1983).
Lal, B. B., et al., IEEE Trans Mag, 27(6):4739 (1991).
Miura, S., et al., IEEE Trans on Magn, 24(6):2718 (1988).
Sanders, I. L., et al., IEEE Trans on Magn, 25(5):3869 (1989).
Shiroishi, Y., et al., IEEE Trans on Magn, 24:2730 (1988).
Yogi, T., et al., IEEE Trans on Magn, 24(6):2727 (1988).

BACKGROUND OF THE INVENTION

Thin-film hard disc magnetic media are widely used in read/write memory devices in computers. Increasingly, there is an effort in the thin-film medium industry to achieve higher recording density (Howard). Among the magnetic properties which are important to a high recording density are:

(1) Coercivity, defined as the magnetic field required to reduce the remanence magnetic flux to 0, i.e., the field required to erase a stored bit of information. Higher coercivity in a medium allows adjacent recorded bits to be placed more closely together without mutual cancellation. Thus, higher coercivity is associated with higher information storage density.

(2) HF signal amplitude, which provides a measure of the signal amplitude recorded at a selected high frequency, typically, between about 4–8 MHz. Signal amplitude depends in part on the magnetic $M_r$ of the medium, the higher the $M_r$, the greater the HF signal amplitude.

(3) Resolution, which provides a measure of the response of a read/write system. Resolution is typically expressed as a ratio (in percent) between the read voltages at HF and LF, where F is as above.

(4) Signal-to-noise ratio (SNR) which defines the ratio of signal amplitude, or peak-to-peak amplitude of a single pulse, as a function of recording frequency, to recording noise at that frequency. A HIGH SNR ratios, due to signal amplitude and/or low noise, are necessary for high density recording.

(5) The isolated readback pulsewidth, PW-50, measured at 50% of base to peak amplitude, indicates the degree of signal distortion at a given readback frequency due to overlap between adjacent signals. ideally, for high density recording, PW-50 should be reduced.

Thin-film media are typically prepared by sputtering an underlayer, such as a chromium underlayer, onto the substrate surface, then sputtering a cobalt-based magnetic thin film over the underlayer. A protective, lubricating carbon overcoat may be applied over the thin-film layer by sputtering.

The requirements for lower fly heights and higher recording densities have placed severe requirements on the substrate. Al/NiP substrates of thicknesses below 35 mils have shown significant problems in maintaining good fly characteristics below 4 microinches. As the thickness of the Al/NiP substrate is reduced, these substrates have also shown a greater susceptibility to handling damage.

Nonmetallic substrates, such as canasite™ (glass-ceramic) or glass substrates, have smoother surfaces and higher flexural strength. As a result, they are capable of providing superior fly properties and are potential replacements for Al/NiP substrates. Unfortunately, longitudinal magnetic media deposited on canasite™ substrates have generally exhibited lower outputs, higher noise and increased bit-shifts over comparable media deposited on Al/NiP substrates.

SUMMARY OF THE INVENTION

The present invention includes, in one aspect, an improvement in a magnetic film recording medium of the type having (a) a disc-like non-metallic substrate, (b) a sputtered Cr underlayer having a thickness between about 200–3,000 Å, and a predominantly (200) crystallographic orientation, (c) a sputtered magnetic thin-film layer having a thickness between about 150–800 Å, and (d) a sputtered carbon overcoat. The improvement, which is effective to reduce the noise of the medium by at least about 25%, comprises a sputtered Cr-containing sublayer formed directly on the substrate, between the substrate and underlayer, and characterized by:

(i) a thickness of between 5 and 80 Å, and (ii) a crystalline structure, characterized by the presence of a predominantly Cr (110) x-ray diffraction line.

In one general embodiment, the sublayer contains oxygen, nitrogen, or carbon in an amount sufficient to produce the desired Cr crystalline structure. In a preferred embodiment, the sublayer contains oxygen in an amount sufficient to produce the Cr (110) crystalline structure, and the sublayer thickness is between about 5–80 Å, preferably 5–15 Å.

In another aspect, the invention includes an improvement in a sputtering method for producing a magnetic thin-film recording medium by successively sputtering onto a disc-like non-metallic substrate, (a) a sputtered Cr underlayer having a thickness between about 200–3,000 Å, and a predominantly (200) crystallographic orientation, (b) a sputtered magnetic thin-film layer having a thickness between about 150–800 Å, and (c) a sputtered carbon overcoat.

The improvement, which is effective to reduce the noise of the medium by at least about 25%, comprises forming directly on the substrate, between the substrate and underlayer, a sputtered Cr-containing sublayer under conditions effective to produce sublayer characteristics of:

(i) a thickness of between 5 and 80 Å, and (ii) a crystalline structure, characterized by the presence of a predominantly Cr (110) x-ray diffraction line.

In one preferred embodiment, the forming includes sputtering a Cr sublayer onto the substrate, to a selected thickness of between 5–80 Å, and allowing the substrate to become partially oxidized before sputtering the Cr underlayer over the sublayer.

The sputtering is preferably carried out to form a sublayer thickness between about 5–20 Å, the sublayer is deposited at a sputtering pressure between about 2–10 mBar, and the substrate is heated to above about 150° C. prior to sputtering.

These and other objects and features of the invention will be more fully appreciated when the following detailed description of the invention is read in conjunction with the accompanying drawings.

DETAILED DESCRIPTION OF THE DRAWINGS

I. Thin-Film Medium

Figure 1:
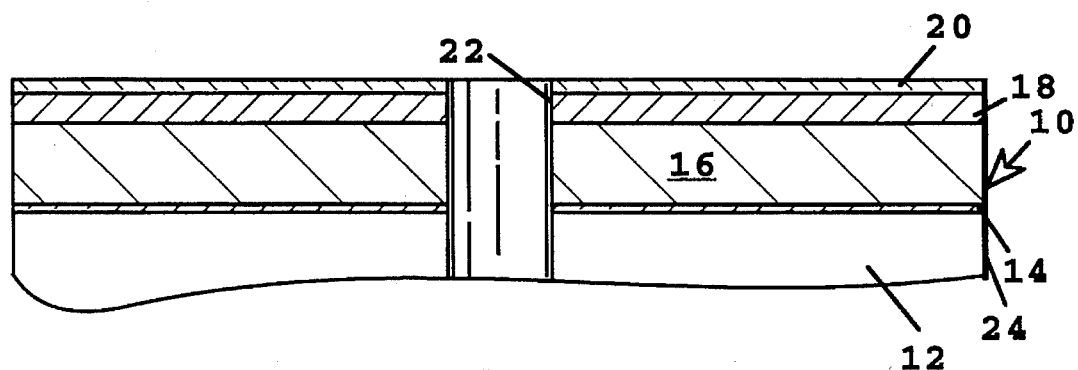
FIG. 1 is a sectional view of a thin-film media formed in accordance with the invention.

FIG. 1 shows in cross section view, a fragmentary portion of a thin-film medium or disc 10 formed in accordance with one embodiment of the invention. The disc generally includes a rigid, non-metallic substrate 12, and forming successive thin-film layers over the substrate, an amorphous, Cr-containing sublayer 14, a crystalline underlayer 16, a magnetic thin-film layer 18, and a protective carbon overcoat 20. It will be appreciated that the disc is symmetrical with respect to its upper and lower surfaces, the lower portion of the disc not being shown in the figure.

The non-metallic substrate may be either a glass, glass-ceramic, or ceramic substrate. An example of a glass-ceramic substrate is a canasite™ substrate. Such substrates are formed initially as an amorphous glass, then heated under conditions which produce a crystalline, ceramic phase. A ceramic substrate may be formed conventionally by scintering alumina particles, then coating the ceramic with a glass surface coating. Such substrates, which are commercially available, have a thickness of about 1.27 mm for a 95 mm disc, and conventional testing is done at ID/OD values of about 0.8 inch and 1.78 inch, respectively.

One method for texturing a glass substrate is described in parent U.S. patent application for "Glass Substrate with Controlled Low-Friction Surface," Ser. No. 475,715, filed Feb. 6, 1990, which is incorporated by reference herein. Alternatively, the glass or ceramic substrate may be micro-roughened by known mechanical texturing methods. In still another embodiment, a disk substrate having a desired surface texturing may be obtained from commercial sources. One such commercial substrate is a canasite™ ceramic substrate available from Corning Glass (Corning, N.Y.). The substrate is available in conventional as well as non-standard thicknesses, and has a micro-roughened surface having a density of zero crossings of about 70/mm, and a peak-to-valley depth of between about 10–30 nm.

Two conventional size substrates have outer diameters of 130 and 95 mm (5.1 and 3.74 inches), with corresponding inner diameters of 40 and 25 mm (1.57 and 0.98 inches), respectively. The discs used for the preferred embodiment of the present invention inner diameters of 0.472 inches and outer diameters of 1.888 inches. The inner and outer edges of the disc which define these diameters are indicated at 22, 24, respectively, in FIG. 1.

Sublayer 12 provides a Cr-containing metal surface for desired underlayer crystal orientation on the substrate, when the underlayer material is sputtered over the sublayer. According to one important consideration, the sputtered Cr-containing sublayer has a crystalline structure, characterized by the presence of a predominantly Cr (110) x-ray diffraction line. Conventional surface x-ray diffraction methods can be used to show the presence of a Cr (110) crystal orientation in the sublayer.

The Cr (110) crystal orientation of the sublayer can be achieved in a variety of ways. In one general embodiment, the sublayer contains a sufficient amount of a nonmetal, preferably oxygen, carbon, or nitrogen, to effectively prevent 200-oriented crystal growth. The amount of oxygen, carbon, or nitrogen required is typically between 5–30 atom percent. As will be seen below, the non-metal element may be introduced into the sputtered underlayer by a combination of (i) allowing a Cr-sputtered sublayer to undergo oxidation prior to forming the underlayer, and/or (ii) conducting the sputtering steps in the presence of oxygen, nitrogen, and/or a carbon containing gas, such as methane.

Alternatively, the Cr-containing sublayer may be a Cr-metal alloy, such as Cr in combination with Ti, Mo, Zr, Hf, Si, Nb, Al, Y, V, Mn, Ag, B, Gd, where the non-Cr metal is present in an amount sufficient to produce the desired Cr (110) crystal orientation in the sputtered sublayer. The non-Cr metal is typically included in the Cr-containing target used for sputtering, as described below.

According to another important consideration, the sublayer is formed to a thickness of between 5–80 Å, preferably 5–50 Å, and more preferably between about 5–15 Å. The preferred sublayer thickness improves HF signal amplitude, resolution, and PW-50 characteristics of the medium, as seen in Section III below. The preferred sublayer thickness also allows for higher coercivity under increased-pressure sputtering conditions, as will be seen in Section II below.

The crystalline underlayer is preferably a sputtered Cr underlayer having a thickness between about 200–3,000 Å, and a predominantly (200) crystallographic orientation, as determined by conventional x-ray surface diffraction techniques.

Magnetic thin-film layer 18 is formed by sputtering onto the underlayer, a target alloy composed of a Co-based alloy such as a Co/Cr or Co/Ni binary alloy, or a Co/Cr or Co/Ni based alloy, i.e., an alloy in which the binary elements constitute about 80 atomic percent or more of the alloy. Exemplary alloys include Co/Cr/Ta, Co/Ni/Pt or Co/Ni/Cr ternary alloy, or a Co/Cr/Ta/Pt or Co/Ni/Cr/Pt quaternary alloy. One preferred magnetic thin film alloy is composed of 60–90 percent Co, 2–15 atom percent Cr, and 10–30 atom percent Ni. The elemental compositions of one exemplary magnetic thin-film alloys, identified herein as TMM #71, is 67 atom percent Co, 8 atom percent Cr, and 25 atom percent Ni. The thin-film layer has preferred thickness between about 100–800 Å, preferably 300–500 Å.

Alternatively, the thin-film magnetic layer may be a multilayer structure composed of two or more magnetic thin-film sublayers, each separated by a thin isolation layer, such as a 2–50 Å Cr isolation layer.

Carbon overcoat 20 in the thin-film medium is preferably a carbon layer formed by sputtering carbon onto the magnetic layer, under conditions in which the carbon is in a predominantly diamond-like structure. The overcoat thickness is preferably between about 100 and 400 Å.

More generally, the invention includes an improved thin-film recording medium of the type having (a) a disc-like non-metallic substrate, (b) a sputtered Cr underlayer having a thickness between about 200–3,000 Å, and a dominant (200) crystallographic orientation, (c) a sputtered magnetic thin-film layer having a thickness between about 150–800 Å, and (d) a sputtered carbon overcoat. The improvement, which is effective to reduce the noise of the medium by at least about 25%, comprises a sputtered Cr-containing sublayer formed directly on the substrate, between the substrate and underlayer, and characterized by:

(i) a thickness of between 5 and 80 Å, and (ii) an amorphous crystalline structure, as characterized by the presence of a predominantly Cr (110) x-ray diffraction line.

II. Method of Reducing Medium Noise

Figure 2:
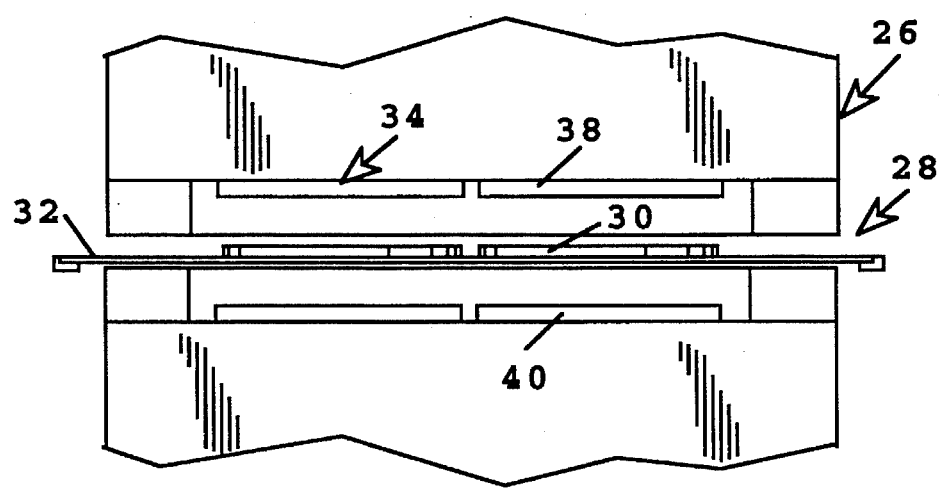
FIG. 2 is a schematic illustration of a portion of a sputtering apparatus used in forming the disc of the invention.

FIG. 2 shows, in schematic view, a portion of a sputtering apparatus 26 which is used, in the method of the invention, for producing the thin-film medium described in Section I. The method will be described with reference to forming the medium illustrated in FIG. 1.

Apparatus 26 includes a vacuum chamber 28 having at least four stations at which sputtering or heating operations occur. A heating station (not shown) at the upstream end of the chamber has a plurality of infrared lights which are arrayed for heating both sides of a substrate, such as substrate 30, carried through the station in the chamber on an disc holder or pallet 32.

Just downstream of the heating station is a first sputtering station 34 at which the sublayer is formed on a substrate, in a manner to be described. The station includes a pair of targets, such as targets 36, 38, effective to sputter chromium onto opposite sides of a substrate, such as substrate 30. The targets in station 34 are preferably pure chromium targets, or chromium alloys containing a sufficient amount of a second non-magnetic metal, e.g., W, Si, Zr, Al, Mn, Nb, Hf, V, Y, B, Ta, Mo, Ag, B, Gd, or Ti, to produce an amorphous Cr/second metal sputtered layer. The percent of second metal is typically 2–30 atom percent in the target.

When the sublayer is a sputtered Cr/C (carbide) or Cr/N (nitride) layer, the first sputtering station may contain a mixture of Ar and either a carbon-containing gas, such as $CH_4$, or $N_2$. Typically, the chamber would contain 10–70 mole percent non-Ar gas, at a total gas pressure of between about 2–20 mBar. Alternatively, the target itself may contain carbon in the form of graphite, or be formed of CrC or CrO.

In one preferred embodiment, the same Cr target is used for forming both the sublayer and Cr underlayer. As will be described below, the Cr-containing sublayer in this embodiment is a partially oxidized Cr sublayer produced by (i) sputtering a 5–80 Å Cr sublayer, and (ii) removing the substrate from the sputtering station, to allow oxidation of the sublayer to occur. The substrate with oxidized sublayer coating is then introduced into the Cr target station again, to form the Cr underlayer.

A second sputtering station (not shown) downstream of chamber 28 is designed for sputtering a magnetic film onto the underlayer. The station includes a pair of sputtering targets for sputtering the magnetic film alloy onto the substrate, after formation of the underlayer on the substrate. As indicated above, the targets in this station are formed of a Co/Cr- or Co/Ni-based alloy, and preferably one containing 60–90 percent Co, 2–20 atom percent Cr, and 10–30 atom percent Ni. The alloy is formed and shaped for use as a sputtering target by conventional metallurgical methods.

The carbon overcoat in the medium is produced by sputtering from a graphite target in a final sputtering station (not shown) in the apparatus.

The basic sputtering apparatus is preferably a commercial system, such as in available from Varian-INTEVAC (Santa Clara, Calif.), Circuits Processing Apparatus (Fremont, Calif.), ULVAC (Japan), Leybald Heraeus (Germany), VACTEC (Boulder, Colo.), or Materials Research Corporation (Albany, N.Y.). These systems are double-sided, in-line, high-throughput machines having two interlocking systems, for loading and unloading.

In operation, the sputtering chamber is evacuated to pressure of about $10^{-7}$ Torr, and argon gas is introduced into the chamber to a final sputtering pressure of 2–20 mTorr (2 to 25 mBar). A preferred argon gas pressure is 5 mTorr.

The substrate is heated in the heating station to a selected temperature before advancing into the two sputtering chambers. The heating conditions in the apparatus are preferably adjusted to achieve a preferred substrate temperature of between about 100° C. and 400° C., although temperatures below 100° may also be employed.

Figure 3:
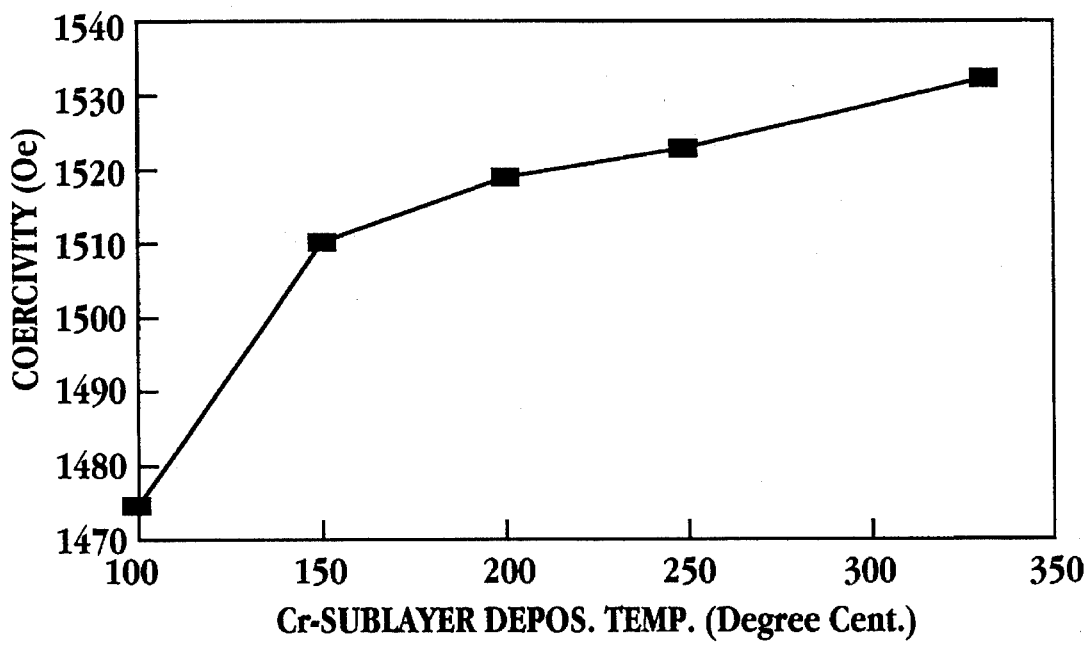
FIG. 3 is a plot of substrate coercivity as a function of sublayer deposition temperature in a thin-film medium having a 20 Å Cr sublayer.

FIG. 3 shows the effect of substrate temperature during Cr sublayer deposition (20 Å sublayer thickness) on the coercivity of a thin-film medium completed by (i) depositing a 1200 Å sputtered Cr underlayer over the sublayer, and (ii) depositing a 350 Å magnetic thin-film layer over the underlayer. The coercivity (in Oe) was measured from vibrating sample magnetometer (VSM) curves conventionally. The thin-film magnetic layer in the media is formed of the above TMM #71 Co/Ni/Cr alloy. As seen, a relatively small increase in coercivity (about 4% increase) is seen at the highest substrate temperature compared with 100° C.

Figure 4:
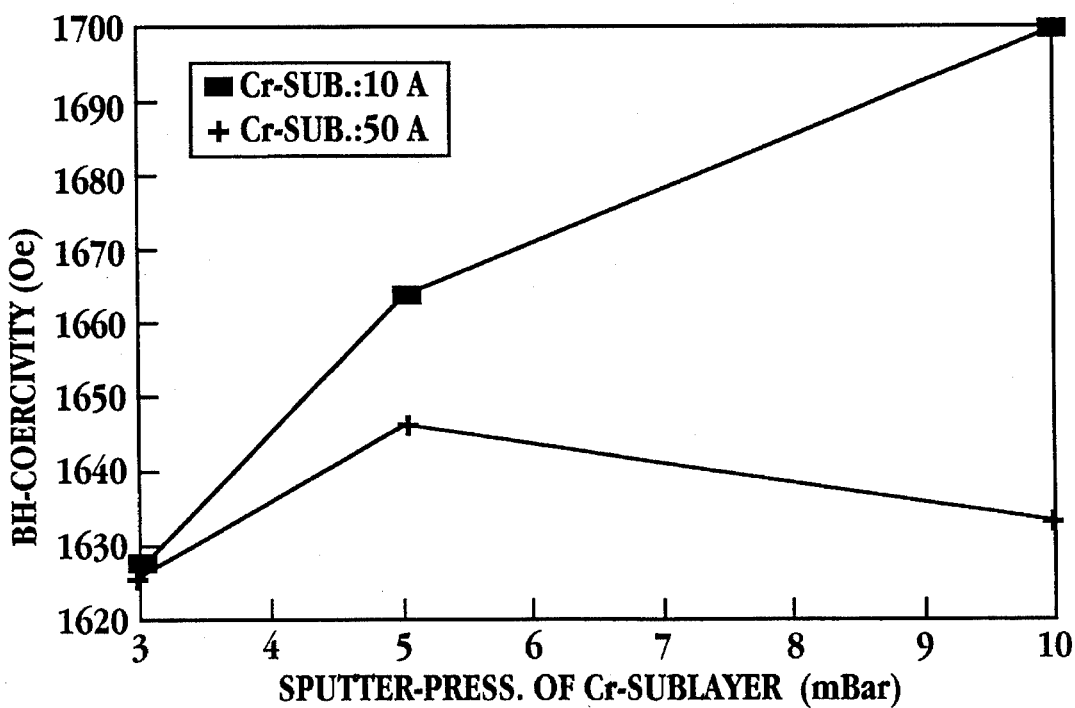
FIG. 4 shows plots of coercivity as a function of sublayer sputtering pressure in media having Cr sublayer thicknesses of 10 Å (solid rectangles) and 50 Å ("+" symbols)

The sputter pressure during sublayer formation may also be adjusted to optimize coercivity in the medium. FIG. 4 shows the effect of sputtering pressure on coercivity in media formed with a Cr sublayer having thicknesses of either 10 Å (solid rectangles) or 50 Å ("+" symbols). As seen, at the lower sublayer thickness, coercivity was about 4–5 percent at higher at 10 mBar than at 3 mBar.

The sputtered sublayer is formed under sputtering conditions effective to produce a 5–50 Å layer. The pressure/coercivity effect noted above provides one advantage of a sublayer in the lower thickness range, e.g., 5–50 Å. As will be seen in Section III below, optimal HF signal amplitude, resolution, and PW-50 properties are also achieved at this lower thickness range.

After sublayer formation, the substrate is moved to a Cr sputtering station for formation of the Cr underlayer. In the case where the sublayer itself is formed in this station, the substrate is positioned outside the station between sublayer and underlayer deposition, to allow partial oxidation of the sublayer before underlayer formation.

The coated substrate is preferably also reheated before underlayer formation, to a preferred temperature of between 250°–400° C. The thin Cr sublayer functions here to increase the rate of heating, in part by providing an internal heat-reflecting surface which reduce heat loss from the non-metallic substrate. The ability to achieve higher and more stable substrate temperature during underlayer formation is another advantage of the invention. In addition, the sublayer allows a DC voltage bias to be applied to the substrate during formation of the sublayer.

The Cr underlayer is formed by conventional sputtering, achieving a dominant (200) crystal orientation required for high coercivity in the medium. The sputtering is carried out to produce a 200–3,000 Å underlayer, and preferably 800–3,000 Å. The sputtering rate from the Cr target is preferably adjusted to achieve a deposition rate of about 40 Å/sec.

After formation of the underlayer, the substrate is moved downstream on a disc holder into the second sputtering chamber, where the magnetic layer is sputtered onto the underlayer. The magnetic thin film is sputtered onto the underlayer under known conditions, such as described in the co-owned U.S. Pat. No. 4,816,127. The pressure and substrate temperature conditions are similar to those described above. The thickness of the magnetic layer is preferably between about 100–800 Å, and more preferably 300–500 Å.

After formation of the magnetic thin film, the substrate is carried on the disc holder toward a third sputtering station (not shown) at which a carbon overcoat is applied according to conventional sputtering methods.

It will be appreciated that a variety of sputtering techniques may be employed to produce an amorphous, Cr-containing substrate in a thin-film medium of the type described. More generally, this aspect of the invention includes an improved method for forming a magnetic thin-film recording medium by successively sputtering onto a disc-like non-metallic substrate, (a) a sputtered Cr underlayer having a thickness between about 200–3,000 Å, (b) a sputtered magnetic thin-film layer having a thickness between about 100–800 Å, and (c) a sputtered carbon overcoat. The improvement, which is effective to reduce the noise of the medium by at least about 25%, comprises sputtering between the substrate and underlayer, a Cr-containing sublayer having a thickness of between 5 and 80 Å.

III. Media Properties

Bulk magnetic properties were determined by vibrating sample magnetometry (VSM) conventionally. Magnetic recording testing was carried out on a Guzik Model RWA 501, using a thin-film inductive reading and recording head with a gap length of 0.38 microns, a gap width of 7.25 microns, and a flying height of 2.5 μin. The head inductance was 1.1 μHenry and resistance, 30 ohms. Recording current was 25–30 mAmps for saturation. The AC-SNR was measured at linear densities between 30 and 100 kiloflux change/inch (KFCI).

In the studies reported below, media were prepared as follows: A canasite substrate (48 mm) was heated to 300° C. and a sputtered Cr sublayer having a selected thickness was formed. The coated substrate was moved from the sputtering station, heated to 300° C., and positioned again in the Cr sputtering station, this time to form a 1200 Å underlayer. A TMM #71 magnetic thin-film layer was the sputtered on the disc, followed by a 200 Å carbon overcoat. The medium was coated with a standard lubricant.

Figure 5A:
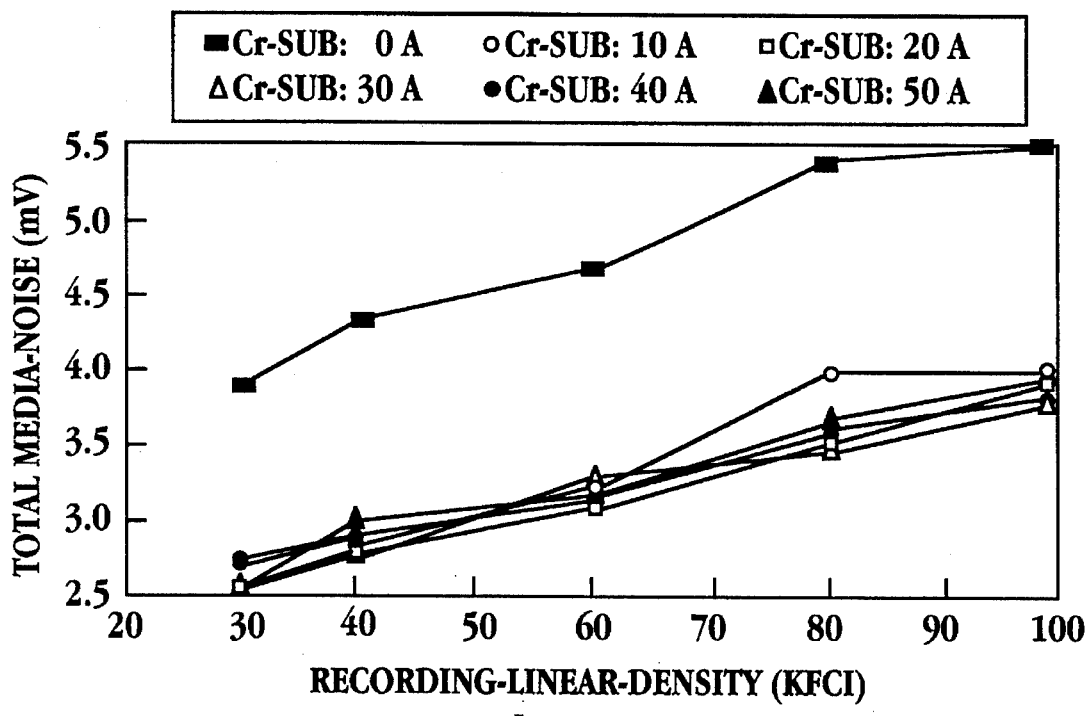
FIG. 5A shows plots of media noise as a function of recording linear density for media having no Cr underlayer (solid rectangles) and Cr sublayer thicknesses of 10 Å (vertical tick), 20 Å ("–" symbols), 30 Å (open rectangles), 40 Å ("X" symbols), and 50 Å (solid triangles)

FIG. 5A shows the effect of sublayer thickness on media noise, measured at linear recording densities of 30, 40, 60, 80, and 100 kiloflux change per inch (KFCl). According to an important feature of the invention, the presence of a 10–50 Å sublayer reduced media noise by 30% or more at each recording density.

Figure 5B:
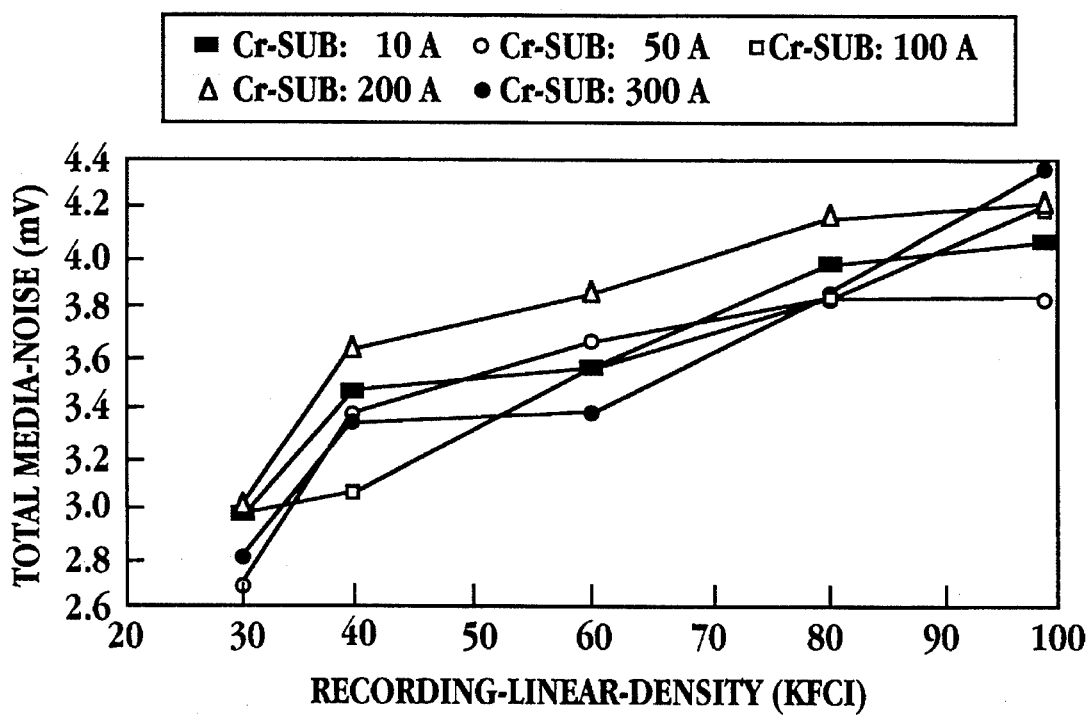
FIG. 5B shows plots of media noise as a function of recording linear density for media having Cr sublayer thicknesses of 10 Å (solid rectangles), 50 Å (vertical tick), 100 Å (stars symbols), 200 Å (open rectangles), and 300 Å ("X" symbols)
Figure 6:
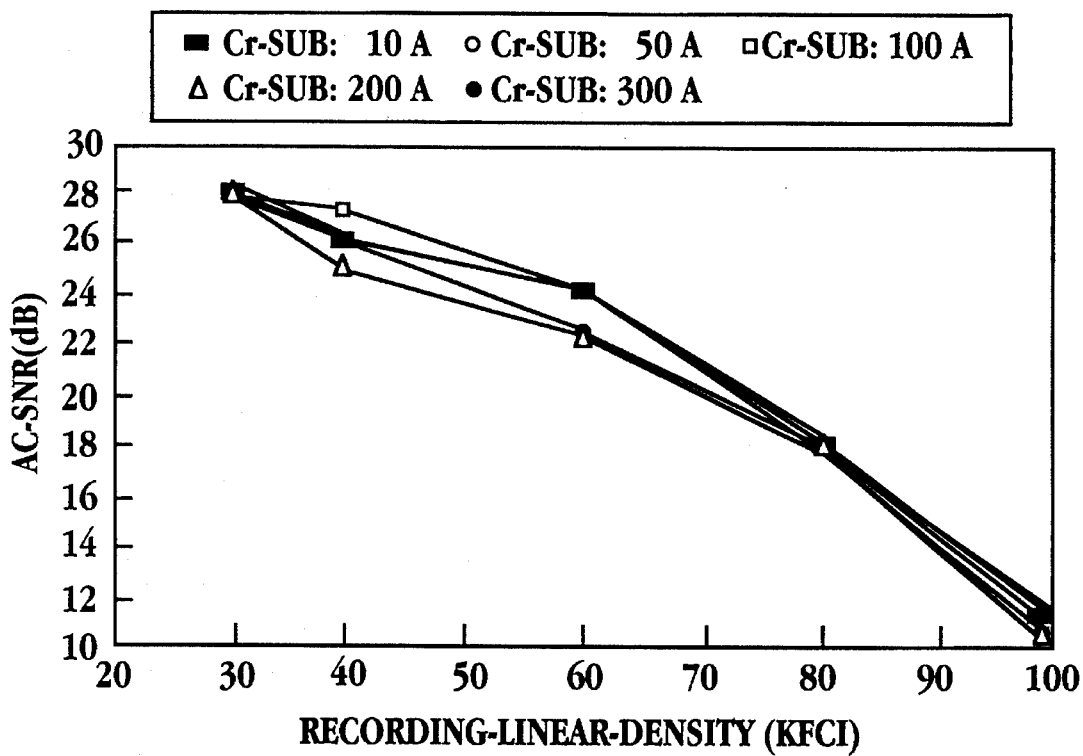
FIG. 6 shows the plots of signal to noise ratio as a function of recording linear density for media having Cr sublayer thicknesses of 10 Å (solid rectangles), 50 Å (vertical tick), 100 Å (stars symbols), 200 Å (open rectangles), and 300 Å ("X" symbols)

The media noise plots shown in FIG. 5B, for sublayer thicknesses between 10 and 300 Å, do not show any systematic effect of sublayer thickness on noise. Nor was a systematic thickness effect on SNR observed for the same sublayer thicknesses (FIG. 6).

The effect of sublayer thickness on the ID parametrics, and media coercivity, are given in Table 1 below.

TABLE 1

| Expt # | BH-Hc (Oe) | Cr-Sub. Thickness | HF (uv) | Res. (%) | OW (-dB) | PW-50 (ns) | BS (ns) |
|---|---|---|---|---|---|---|---|
| | | ID:R = 0.466" (HF: 4.331 Mhz) | | | | | |
| | | Cr-Sublayer Thickness Effect: | | | | | |
| #F | 1679 | 0Å | 210 | 93.8 | 34.2 | 115.8 | 26.4 |
| #D-6 | 1669 | 10Å | 233 | 96.8 | 34.2 | 112.6 | 18.8 |
| #D-10 | 1691 | 50Å | 229 | 96.8 | 33.9 | 113.6 | 19.6 |
| #A-2 | 1684 | 100Å | 230 | 95.1 | 33.8 | 114.2 | 20.1 |
| #A-3 | 1744 | 200Å | 224 | 94.5 | 33.8 | 112.1 | 20.4 |
| #A-4 | 1742 | 300Å | 222 | 94.4 | 33.6 | 114.5 | 19.9 |

Figure 7:
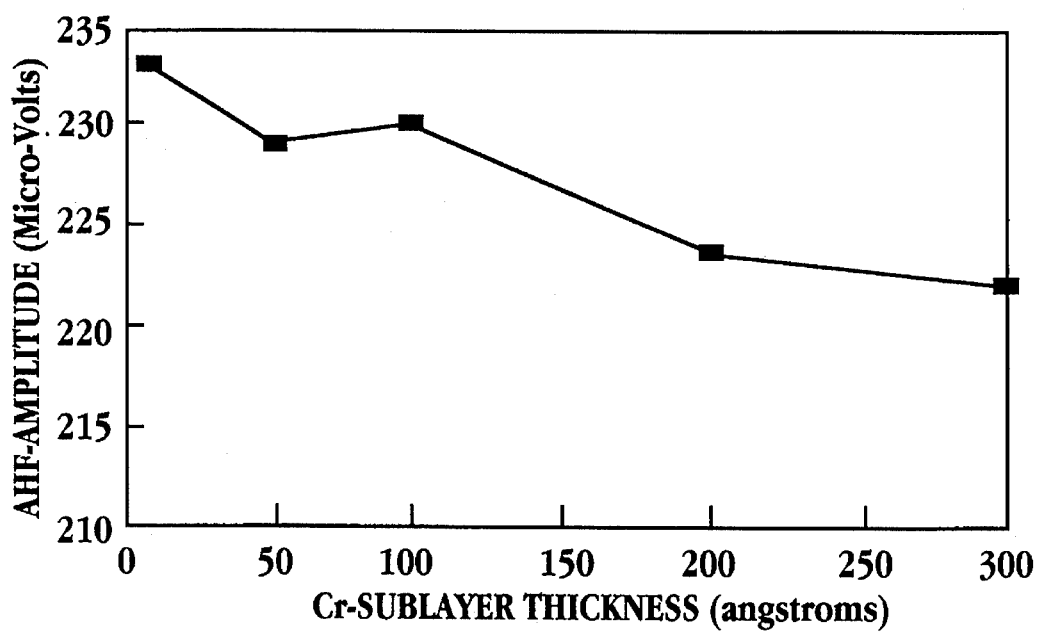
FIG. 7 shows a plot of HF signal amplitude as a function of Cr sublayer thickness in a thin-film medium.
Figure 8:
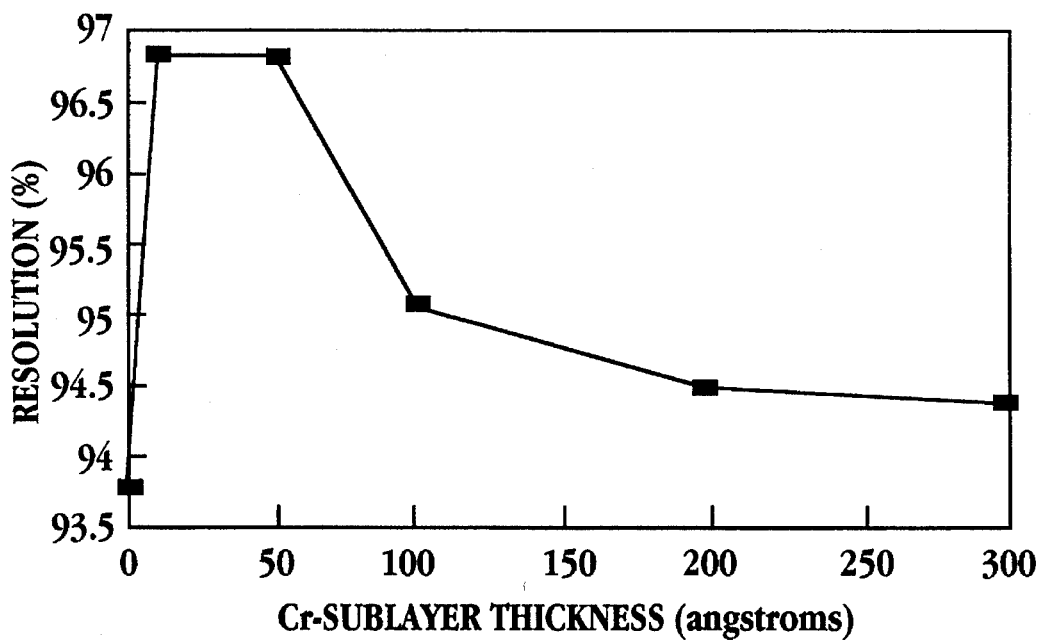
FIG. 8 shows a plot of resolution ( % ) as a function of Cr sublayer thickness in a thin-film medium.
Figure 9:
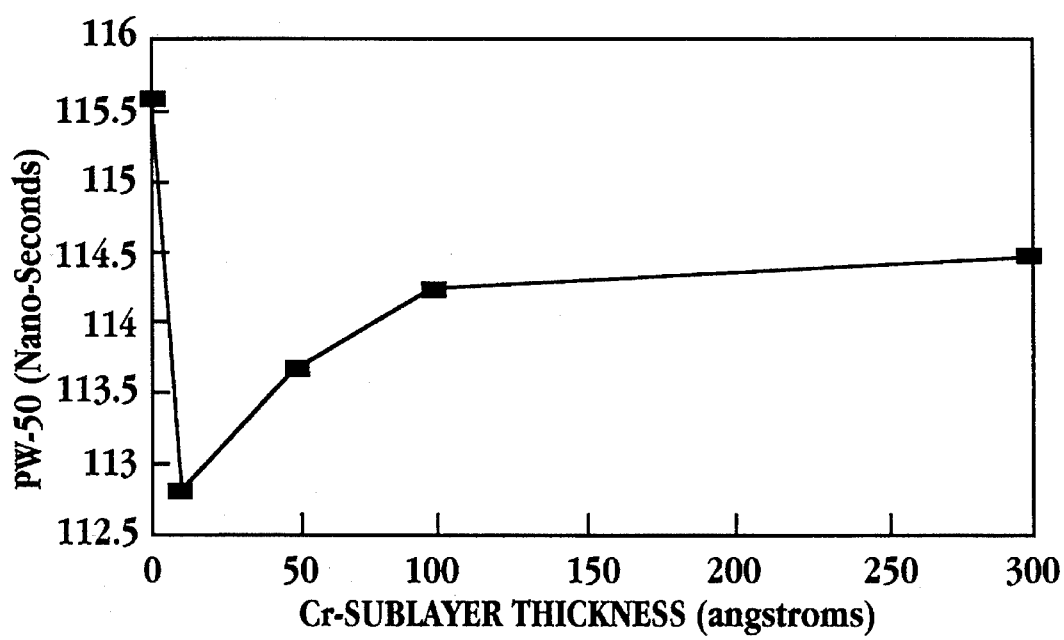
FIG. 9 shows a plot of PW-50 as a function of Cr sublayer thickness in a thin-film medium.

As seen, HF signal amplitude, resolution, and PW-50 all have a pronounced sublayer-thickness effect. FIG. 7 shows the effect of sublayer thickness on HF signal amplitude. A peak at 10 Å is seen, with a gradual decrease in signal amplitude with increasing sublayer thickness. Similarly, for media resolution, a peak between 10–50 Å was observed, with a gradual decrease at greater sublayer thicknesses (FIG. 8). PW-50 values are plotted in FIG. 9, showing optimal pulse width values at 10 Å sublayer thickness.

Although the invention has been described with respect to particular embodiments, it will be apparent to those skilled in the art that various changes and modifications can be made without departing from the invention.

It is claimed:

1. In a magnetic film recording medium having (a) a non-metallic substrate, (b) a sputtered Cr underlayer having a thickness between about 200–3,000 Å, and a (200) crystallographic orientation, (c) a sputtered magnetic thin-film layer having a thickness between about 100–800 Å, and (d) a sputtered carbon overcoat, an improvement effective to reduce the noise of the medium by at least about 25%, comprising a sputtered Cr sublayer also containing oxygen, nitrogen, or carbon, and formed directly on said substrate, between said substrate and underlayer, and having:

(i) a thickness of between 5 and 50 Å, and (ii) a crystalline structure, characterized by a Cr (110) crystallographic orientation as determined by x-ray diffraction.

2. The medium of claim 1, wherein the sublayer is 5–15

Å in thickness and contains oxygen.

3. In a method for forming a magnetic thin-film recording medium by successively sputtering onto a non-metallic substrate, (a) a Cr underlayer having a thickness between about 200–3,000 Å, and a (200) crystallographic orientation, (b) a magnetic thin-film layer having a thickness between about 150–800 Å, and (c) a carbon overcoat, an improvement effective to reduce the noise of the medium by at least about 25%, comprising forming directly on said substrate between said substrate and underlayer, a sputtered Cr sublayer also containing oxygen, nitrogen, or carbon, sputtered under conditions effective to produce sublayer characteristics of:

(i) a thickness of between 5 and 50 Å, and (ii) a crystalline structure, characterized by a Cr (110) crystallographic orientation as determined by x-ray diffraction.

4. The method of claim 3, wherein said forming includes sputtering in a Sputtering station a Cr sublayer onto the substrate, to a selected thickness of between 5–50 Å, and removing the substrate from the sputtering station to allow oxidation of the sublayer before sputtering the Cr underlayer over the sublayer.

5. The method of claim 3, wherein a D.C. bias is applied to the substrate after said forming, and during sputtering of said underlayer.

6. The method of claim 4, wherein said sputtering is effective to form a sublayer thickness between about 5–20 Å.

7. The method of claim the 5, wherein the sublayer is deposited at a sputtering pressure between about 2–30 mBar.

8. The method of claim 6, wherein said forming includes heating the substrate to above about 150° C. prior to said sputtering.

* * * * *